(12) United States Patent
Urabe (10) Patent No.: US 6,174,805 B1
(45) Date of Patent: Jan. 16, 2001

(54) TITANIUM FILM FORMING METHOD

(75) Inventor: Koji Urabe, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/198,005

(22) Filed: Nov. 23, 1998

(30) Foreign Application Priority Data

Nov. 26, 1997 (JP) .................................................. 9-325040

(51) Int. Cl.$^7$ ................................................. H01L 21/4763
(52) U.S. Cl. ........................ 438/648; 438/680; 438/685; 438/694; 438/676; 438/677
(58) Field of Search ..................................... 438/648, 680, 438/685, 694, 676, 677

(56) References Cited

U.S. PATENT DOCUMENTS

| | | | | |
|---|---|---|---|---|
| 4,951,602 | * | 8/1990 | Kanai .................................... | 118/719 |
| 5,834,371 | * | 11/1998 | Ameen et al. ........................ | 438/656 |
| 5,926,737 | * | 7/1999 | Ameen et al. ........................ | 438/649 |

* cited by examiner

Primary Examiner—David Nelms
Assistant Examiner—Renee' R. Berry
(74) Attorney, Agent, or Firm—Hutchins, Wheeler & Dittmar (57) ABSTRACT

In a titanium film forming method of this invention, before a titanium film is formed, the temperature in a reaction chamber for forming the titanium film is set to a temperature or more at which hydrogen chloride is produced by chlorine and hydrogen. A hydrogenated gas is then fed into the reaction chamber for a predetermined period of time. With this process, before the titanium film is formed, chlorine gas and titanium chloride gas left in the reaction chamber for forming the titanium film are reduced.

12 Claims, 5 Drawing Sheets

TITANIUM FILM FORMING METHOD

BACKGROUND OF THE INVENTION

The present invention relates to a titanium film forming method and, more particularly, to a titanium film forming method of depositing titanium by chemical vapor deposition using a plasma, which can be applied to a semiconductor device manufacturing method including the step of forming a barrier metal.

With an increase in LSI integration degree, the diameter of a contact hole decreases, and the aspect ratio (depth/diameter) increases. Assume that interconnections are to be connected to the source and drain of a MOS transistor through contact holes having such a high aspect ratio. In this case, first, a silicide of a refractory metal such as titanium is formed at the interface doped with an impurity. Second, tungsten is used as a conductive material to be filled into the contact holes.

The first point will be described first. When, for example, aluminum is filled as a plug into a contact hole formed in an impurity region such as a source or drain in a silicon substrate, the aluminum is diffused in the silicon substrate. With an increase in LSI integration degree, impurity regions such as a source and drain are formed more shallowly. For this reason, an aluminum diffusion region reaches a portion deeper than an impurity diffusion region. If the plug material is diffused deeper than the impurity region in this manner, the function of the transistor is impaired.

If, for example, titanium silicide is formed on the bottom portion of the contact hole in advance, and the plug is formed on it, diffusion of the plug material into the silicon substrate can be prevented, thus solving the above problem.

The second point will be described next. A plug must be filled into a contact hole without producing any voids. It is not easy to fill a micropatterned contact hole having a high aspect ratio with a plug without producing any voids as described above. If, for example, aluminum is filled into the contact hole by sputtering, a void is produced in the central portion of the contact hole. For this reason, as is well known, tungsten is filled into the contact hole to form a plug by chemical vapor deposition (CVD). Since the CVD method exhibits excellent step coverage characteristics, the contact hole can be filled without any void. Tungsten is selected as a material which can be deposited by the CVD method and has a low resistance.

As described above, when contacts for connecting interconnections to the source and drain of a micropatterned MOS transistor, a refractory metal silicide such as titanium silicide is formed at the interface between each contact and the silicon substrate, and tungsten is formed on the silicide by the CVD method to fill each contact hole.

A conventional method of manufacturing a semiconductor device having contact holes formed in the above manner will be briefly described below.

The following is a case wherein contacts to be connected to a source and drain are formed.

Figure 5A:
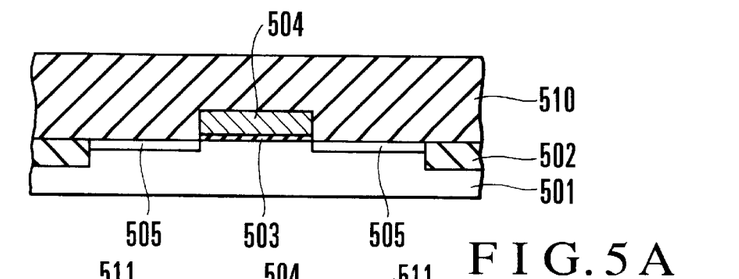
FIGS. 5A to 5E are sectional views for explaining the process of manufacturing a semiconductor device by using a conventional titanium film forming method.

First of all, as shown in FIG. 5A, silicon oxide is deposited on a silicon substrate 501, on which a MOS transistor is formed, so as to form an insulating interlayer 510. In this case, the MOS transistor is formed in a region partitioned by an element isolation oxide film 502 in the silicon substrate 501. This MOS transistor is made up of a gate electrode 504 formed through a gate insulating film 503 and a source and drain 505 formed by doping an impurity having a desired conductivity type into portions of the silicon substrate 501 which are located on the two sides of the gate electrode 504.

Figure 5B:
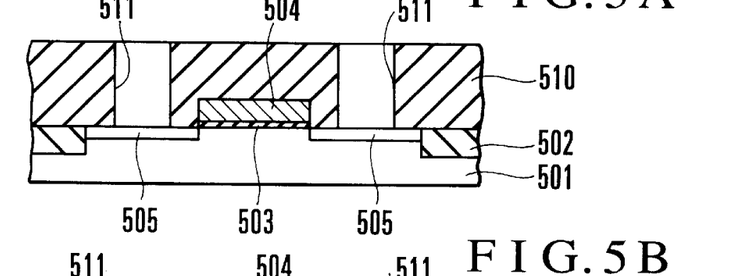

Subsequently, as shown in FIG. 5B, contact holes 511 are formed in the insulating interlayer 510 to expose the source and drain 505 formation regions.

Figure 5C:
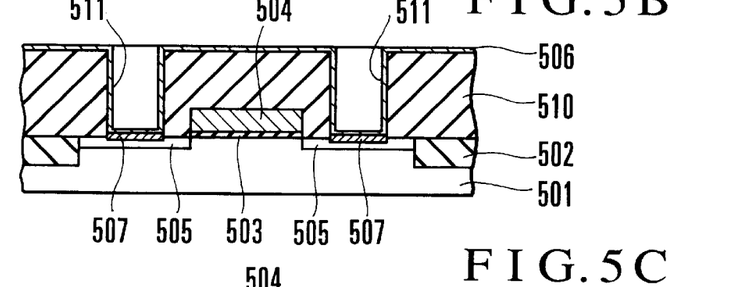

As shown in FIG. 5C, a titanium film 506, which is a refractory metal film, is formed on the insulating interlayer 510 including the bottom portions and side surfaces of the contact holes 511 to have a thickness of about 10 nm. This titanium film 506 may be formed by depositing titanium by chemical vapor deposition using titanium tetrachloride, hydrogen, and argon as source gases. This deposition is performed while the silicon substrate 501 is heated to about 500° C. With this process, the titanium film 506 and the silicon substrate 501 are made to react with each other to form a titanium silicide film 507 having a thickness of about 20 nm at the interface therebetween.

If tungsten is deposited on the titanium silicide film 507 to fill the contact holes 511, interconnections through the contact holes 511 can be formed. However, the deposition of tungsten reduces the titanium silicide film 507. A tungsten film is formed to fill the contact holes by CVD using $WF_6$ as a source gas. In this formation of a tungsten film by CVD, since $WF_6$ is used, the film formation atmosphere contains fluorine. Since this fluorine and titanium readily form a compound, and this titanium fluoride is a gas, the titanium content of this fluoride becomes lower than that of the titanium silicide film 507. That is, in forming a tungsten film by CVD, titanium silicide is etched. Since almost no titanium film 506 is left on the titanium silicide film 507, if a tungsten film is directly formed on the titanium silicide film 507 by CVD, the titanium silicide film 507 is reduced.

To prevent this, when titanium silicide is used as a barrier film, and a tungsten film is to be formed on the barrier film by CVD as described above, a titanium nitride film is formed to protect the titanium silicide.

First of all, to form this titanium nitride film on the titanium film 506, the titanium film 506 is exposed to ammonia to form a titanium nitride film 506a. This prevents a newly deposited titanium nitride film from peeling off. This is because a titanium nitride film formed on a titanium film tends to peel off.

Figure 5D:
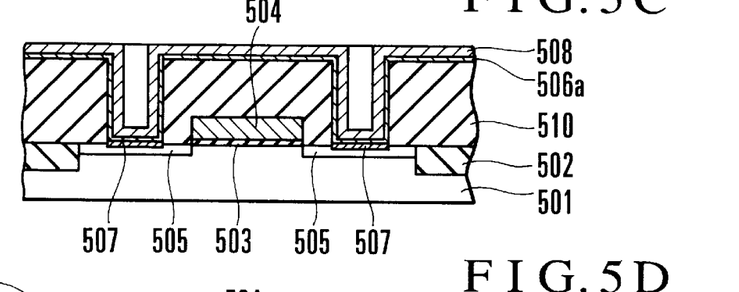

With the above process, a new titanium nitride film 508 having a thickness of about 500 nm is formed on the titanium nitride film 506a having undergone transformation by nitriding, as shown in FIG. 5D. This film may be deposited by chemical vapor deposition using titanium tetrachloride, hydrogen, and argon as source gases.

Figure 5E:
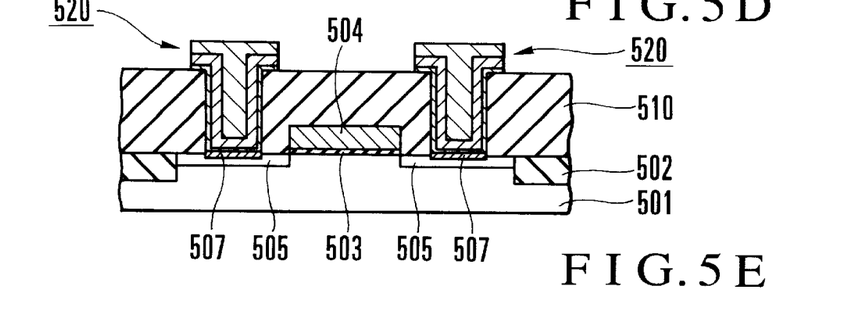

A tungsten film is then formed on the resultant structure by CVD using $WF_6$ as a source gas. Thereafter, the tungsten film and the titanium nitride films 506a and 508 on the insulating interlayer 510 are patterned to form interconnections 520 connected to the source and drain 505, as shown in FIG. 5E.

The process described above attaches importance to the thickness of the titanium film 506 which determines the thickness of the titanium silicide film 507 to a certain degree.

If the titanium film 506 is excessively thick, the titanium silicide film 507 also becomes thick. An increase in the thickness of the titanium silicide film 507 leads to an increase in consumption of silicon in the silicon substrate 501. If the titanium silicide film 507 is excessively thick, the bottom portion of the titanium silicide film 507 extends through the source and drain 505 formation region to come into contact with the silicon substrate 501. That is, if the titanium film 506 is excessively thick, the interconnections 520 cannot be properly connected to the source and drain 505.

In contrast to this, if the titanium film 506 is excessively thin, since the titanium silicide film 507 becomes thin, the resistance between the interconnections 520 and the source and drain 505 through the titanium nitride film 508 and the like increases.

The above titanium film is formed by plasma CVD using RF discharge based on titanium chloride gas as a source for the following reasons.

First of all, plasma CVD allows film formation at a temperature lower than that in thermal CVD, and also allows film formation at a proper deposition rate even by using a material that cannot react or react very slowly in a thermal process. According to plasma CVD, therefore, a thin titanium film can be formed while the formation of titanium oxide is suppressed. Titanium exhibits excellent corrosion resistance at temperatures around room temperature, but becomes very active and easily oxidizes at high temperatures. As compared with thermal CVD, plasma CVD exhibits excellent step coverage characteristics with respect to finer structures.

According to this CVD method using a plasma, film formation is performed in a reaction chamber forming a vacuum vessel in which a vacuum can be produced. More specifically, a substrate to be processed is placed in the reaction chamber, and the chamber is evacuated. Thereafter, titanium tetrachloride, hydrogen, and argon as source gases are fed into the reaction chamber, and argon plasma is generated by applying RF discharge into the reaction chamber while the substrate is heated. Upon generation of the plasma, the titanium tetrachloride is decomposed, and the resultant titanium is deposited on the substrate. In this case, the generated titanium is deposited on not only the substrate but also other portions in the reaction chamber.

Meanwhile, decomposed chlorine is generated to form a titanium film in the reaction chamber. If this generated chlorine is left in the reaction chamber, it reacts with titanium deposited in the reaction chamber to newly form titanium chloride. The presence of this generated titanium chloride causes excessive titanium chloride gas to be supplied to the substrate to be processed. In this state, the thickness of the titanium film 506 exceeds a desired value.

In a state wherein titanium is deposited in the reaction chamber, a titanium film is formed to have a thickness exceeding a desired thickness. If the settings are changed to decrease the thickness of this film, the formed films become excessively thin with an increase in the number of substrates to be processed. This is because, as the number of substrates on which thin titanium films are to be formed increases, the titanium deposited in the reaction chamber is consumed, the supply of excess titanium chloride gas decreases.

In this case, the resultant titanium film becomes thinner than a planned film. As a result, the obtained titanium film becomes excessively thin, and the titanium silicide layer becomes excessively thin.

As described above, when thin titanium films are to be formed by plasma CVD, the obtained thin titanium films vary in thickness depending on the number of substrates to be processed.

As described above, such variations in film thickness pose a serious problem when the thickness of each titanium film to be formed is to be accurately controlled.

SUMMARY OF THE INVENTION

It is, therefore, a principal object of the present invention to provide an environment in which a titanium film can be formed at a stable deposition rate of titanium.

In order to achieve the above object, according to an aspect of the present invention, there is provided a titanium film forming method comprising at least the first step of setting temperatures of an inner wall of a reaction chamber evacuated to a predetermined vacuum and a structural member placed in the reaction chamber to not less than a temperature at which hydrogen chloride is produced by chlorine and hydrogen, and feeding a hydrogenated gas into the reaction chamber for a predetermined period of time, the second step of placing a substrate to be processed in the reaction chamber after feeding of the hydrogenated gas into the reaction chamber is stopped, the third step of evacuating the reaction chamber to a predetermined vacuum, and the fourth step of respectively feeding at least titanium chloride gas and argon gas into the reaction chamber at predetermined flow rates, generating a plasma of the gases above a film formation surface of the substrate, and forming a titanium film on the substrate.

With this arrangement, in the first step, chloride gas and titanium chloride gas left in the reaction chamber are reduced.

According to another aspect of the present invention, there is provided a titanium film forming method comprising at least the first step of placing a first substrate to be processed in a reaction chamber, the second step of evacuating the reaction chamber to a predetermined vacuum, the third step of respectively feeding at least titanium chloride gas and argon gas into the reaction chamber at predetermined flow rates, generating a plasma of the gases above a film formation surface of the first substrate, and forming a titanium film on the first substrate, the fourth step of setting temperatures of an inner wall of the reaction chamber and a structural member placed in the reaction chamber to not less than a temperature at which hydrogen chloride is generated by chlorine and hydrogen, and feeding a hydrogenated gas into the reaction chamber for a predetermined period of time, the fifth step of unloading the first substrate from the reaction chamber after feeding of the hydrogenated gas into the reaction chamber is stopped, the sixth step of placing a second substrate in the reaction chamber, the seventh step of evacuating the reaction chamber to a predetermined vacuum, and the eighth step of respectively feeding at least titanium chloride gas and argon gas into the reaction chamber at predetermined flow rates, generating plasma of the gases above a film formation surface of the substrate, and forming a titanium film on the second substrate.

With this arrangement, in the fourth step, chloride gas and titanium chloride gas left in the reaction chamber can be reduced while the first substrate on which the titanium film is formed is present in the reaction chamber.

DESCRIPTION OF THE PREFERRED EMBODIMENTS

The embodiments of the present invention will be described in detail below with reference to the accompanying drawings.

First Embodiment

The first embodiment of the present invention will be described first.

In this case, a titanium film is formed to form titanium silicide used as a barrier metal of a semiconductor device.

Figure 1A:
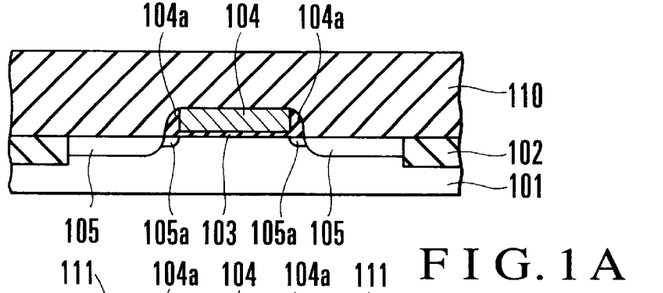
FIGS. 1A to 1E are sectional views for explaining the process of manufacturing a semiconductor device by using a titanium film forming method according to the first embodiment of the present invention.

First of all, as shown in FIG. 1A, silicon oxide is deposited on a silicon substrate 101, on which a MOS transistor is formed, so as to form an insulating interlayer 110 having a thickness of about 2 μm. This MOS transistor has a known LDD structure. The MOS transistor is formed in a region, of the silicon substrate 101, which is partitioned by an element isolation oxide film 102 having a thickness of about 200 nm. In addition, the MOS transistor includes a gate electrode 104 formed through a gate insulating film 103. Side walls 104a are formed on the side surfaces of the gate electrode 104. The MOS transistor also has a source and drain 105 formed by doping portions, of the silicon substrate 101, which are located on the sides of the side walls 104a of the gate electrode 104 with an impurity having a desired conductivity. The MOS transistor has lightly doped regions (LDD) 105a formed under the side walls 104a to have an LDD structure.

Figure 1B:
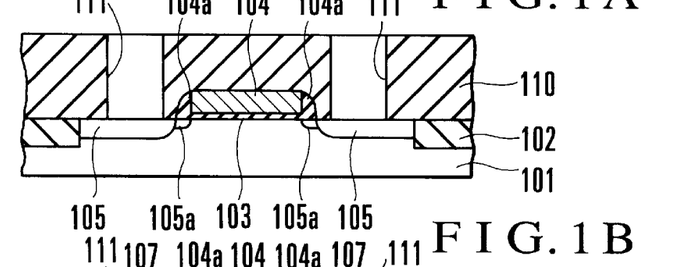

Subsequently, as shown in FIG. 1B, contact holes 111 are formed in the insulating interlayer 110 to expose the surfaces of the source and drain 105 formation regions. These holes may be formed by using a mask pattern formed by a known photolithographic technique, and selectively etching the insulating interlayer 110 by using the mask pattern as a mask. Note that this mask pattern is removed after the contact holes 111 are formed.

Figure 1C:
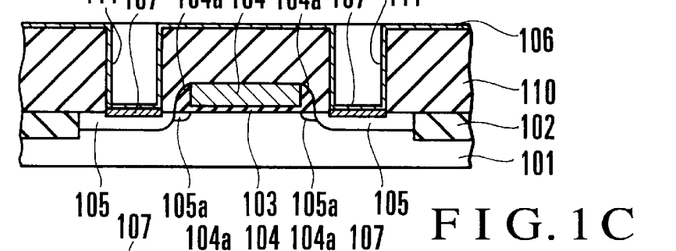

As shown in FIG. 1C, a titanium film 106 having a thickness of about 10 nm is formed on the insulating interlayer 110 including the bottom portions and side surfaces of the contact holes 111. For example, this titanium film 106 is formed by a titanium film forming apparatus using the plasma CVD method shown in FIG. 2A. This titanium film forming apparatus includes a substrate holder 202, on which a substrate to be processed is placed, in a reaction chamber 201. The substrate holder 202 has a resistance heater 203 and can heat the substrate placed thereon. An upper electrode 204 is placed in the reaction chamber 201 to oppose the substrate holder 202. RF discharge can be applied between the upper electrode 204 and the substrate holder 202. Many holes are formed in the upper electrode 204 to allow a gas such as argon to be fed into the reaction chamber through the holes. The reaction chamber 201 can be evacuated by an evacuation means (not shown) connected to vents 205.

Figure 2A:
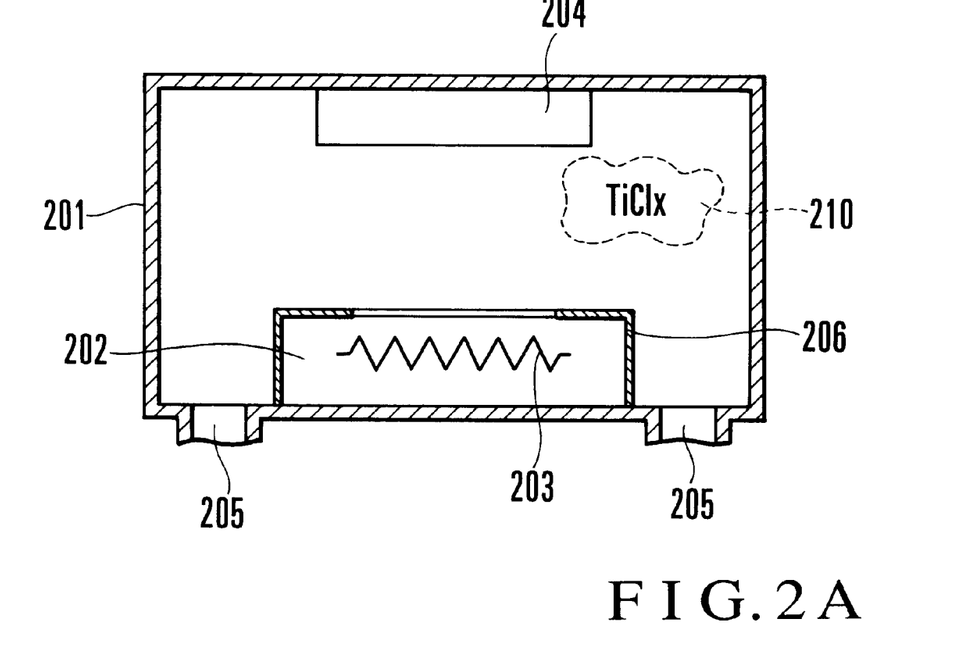
FIGS. 2A and 2B are sectional views showing the arrangement of a titanium film forming apparatus in the first embodiment of the present invention.

For example, therefore, the reaction chamber 201 is evacuated by the evacuation means (not shown), and argon gas is fed into the chamber through the upper electrode 204 to produce a predetermined vacuum in the chamber. When RF discharge is applied between the upper electrode 204 and the substrate holder 202 in this state, a plasma can be generated above the substrate holder 202. After titanium tetrachloride gas and hydrogen gas are fed into the reaction chamber 201, in addition to argon, the plasma is generated to form a titanium film on the substrate placed on the substrate holder 202.

In this case, for example, the titanium film is formed under the following conditions. Titanium tetrachloride, hydrogen, and argon are respectively fed at 2 sccm, 1,000 sccm, and 500 sccm, the substrate temperature is controlled to become 600° C., and the pressure in the reaction chamber 201 is set to 5 Torr. In this state, an RF electric output of 500 kW is applied to generate the plasma.

With the above process, as shown in FIG. 1C, the titanium film 106 is formed. At this time, the substrate temperature is set to 600° C., as described above. For this reason, as shown in FIG. 1C, a titanium silicide film 107 having a thickness of about 20 nm is formed on the bottom portion of each contact hole 111. This film is formed when the titanium film 106 reacts with the silicon substrate 101, and the titanium film 106 partly becomes a silicide. The titanium silicide film 107 then functions as a barrier film.

If tungsten is deposited on the titanium silicide films 107 to fill the contact holes 111, interconnections to be connected through the contact holes 111 can be formed. As described above, however, the deposition of tungsten reduces the titanium silicide films 107.

For this reason, when tungsten is to be deposited in the contact holes 111 by CVD to protect the titanium silicide, a titanium nitride film is formed.

To form this titanium nitride film on the titanium film 106, for example, the titanium film 106 is exposed to ammonia to be nitrided into a titanium nitride film 106a. This prevents a newly deposited titanium nitride film from peeling off. A titanium nitride film formed on a titanium film easily peels off.

This nitriding process is performed by using, for example, a plasma processing apparatus for a nitriding process. First of all, the substrate 101 is placed in the reaction chamber of this processing apparatus. The pressure in the reaction chamber is then set to about 20 Torr while ammonia gas is fed at about 100 sccm. An RF discharge output of 500 kW is applied into the chamber. As a result, the exposed titanium film 106 is nitrided to become the titanium nitride film 106a.

Figure 1D:
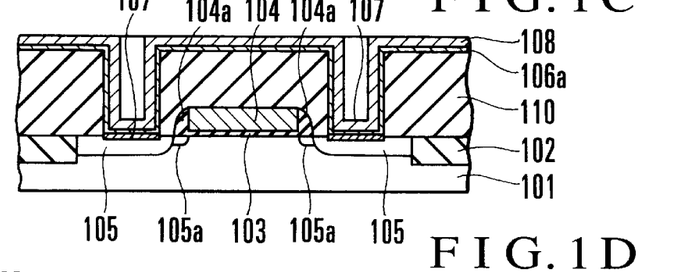

As shown in FIG. 1D, a titanium nitride film 108 having a thickness of about 50 nm is formed on the titanium nitride film 106a by CVD. This titanium nitride film 108 is formed under the following process conditions. Titanium tetrachloride, ammonia, and nitrogen are respectively fed at 40 sccm, 100 sccm, and 3,000 sccm, the pressure is set to 20 Torr, and the substrate temperature is set to 600° C.

Figure 1E:
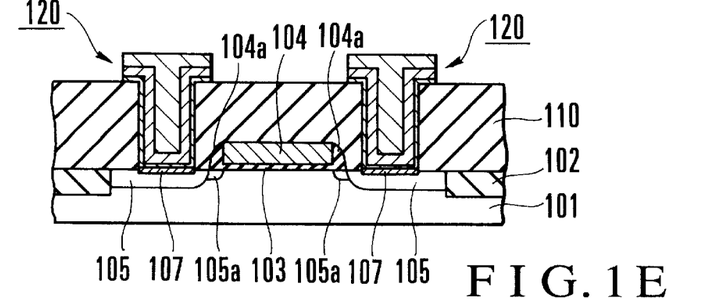

After this process, a tungsten film is formed by CVD using $WF_6$ as a source gas. This tungsten film and the titanium nitride films 106a and 108 on the insulating interlayer 110 may be patterned to form interconnections 120 connected to the source and drain 105, as shown in FIG. 1E.

In this case, as described above, the thickness of the titanium film 106 in FIG. 1C greatly influences the connection state between the interconnection 120 and the source and drain 105. The thickness of this titanium film 106 is controlled on the basis of the feed amounts of the respective gases, i.e., titanium tetrachloride, hydrogen, and argon, the pressure in the reaction chamber which is associated with these gases, the substrate temperature, the RF power to be applied, and the film formation time. If the amount of titanium tetrachloride gas in the reaction chamber exceeds beyond the control while the film thickness is controlled by these factors, the thickness of the titanium film cannot be accurately controlled.

More specifically, as shown in FIG. 2A, according to the first embodiment, in the reaction chamber 201 of the titanium film forming apparatus, titanium films 206 are formed on peripheral portions of the substrate holder 202 and the like. Meanwhile, as described above, in the reaction chamber 201, decomposed chlorine is generated to form a titanium film. As a result, in the reaction chamber 201, since the chlorine and the above titanium react with each other, residual gases 210 such as chlorine gas and $TiCl_x$ gas are floating in the air. As described above, the presence of the residual gases 210 hinders accurate thickness control on the titanium film 106.

Figure 2B:
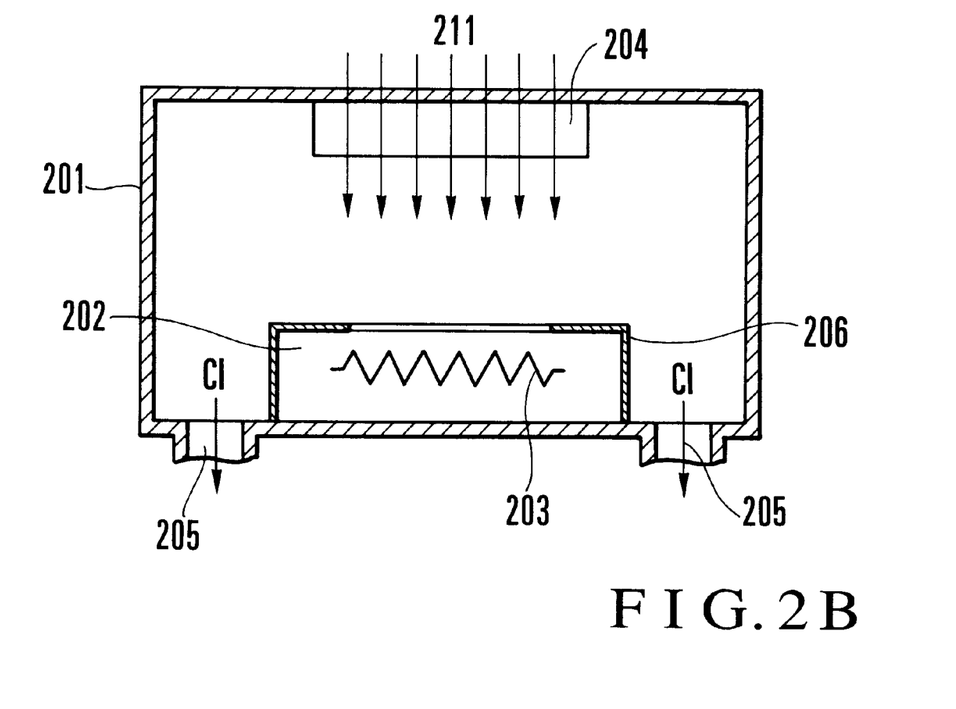

For this reason, in the first embodiment, such residual chlorine gas and titanium chloride ($TiCl_x$) gas are removed as follows. As shown in FIG. 2B, a predetermined amount of hydrogenated gas 211 is fed into the reaction chamber 201 through the upper electrode 204. The feeding of the gas 211 into the reaction chamber 201 is then stopped. The pressure in the reaction chamber 201 is released to the atmospheric pressure. Thereafter, a substrate to be processed is loaded into the reaction chamber 201 and placed on the substrate holder 202, and a titanium film forming process is performed. That is, the film forming process for the titanium film 106 in FIG. 1C is performed. In the process using this gas 211, the reaction chamber 201 is evacuated up to 1 Torr, and the temperature in the reaction chamber 201 is raised to about 600° C. In this state, a silane gas may be fed into the chamber at 100 sccm for 30 sec. As the gas 211, a hydrogenated gas such as $B_2H_6$ or $AsH_4$ may be used instead of a silane gas such as $SiH_4$ or $Si_2H_2$.

When the gas 211 fed into the reaction chamber 201 set at a high temperature of about 600° C. comes into contact with the residual chlorine, hydrogen is liberated from the gas 211 and reacts with the chlorine to form hydrogen chloride. Likewise, when the gas 211 fed into the reaction chamber 201 comes into contact with the residual titanium chloride gas, hydrogen is liberated from the gas 211 and reacts with chlorine in the titanium chloride to form hydrogen chloride. This is because, the binding energy between chlorine and hydrogen is higher than that between chlorine and nitrogen. In the above description, the temperature in the reaction chamber 201 is set to about 600° C. However, the present invention is not limited to this, and this temperature may be set to a temperature or more at which a reaction that forms hydrogen chloride starts. That is, the temperature may be set to a temperature or more at which hydrogen chloride is produced by the fed hydrogenated gas and the residual chlorine gas or titanium chloride gas.

This hydrogen chloride gas can be easily removed from the reaction chamber 201 by an evacuation process as compared with chlorine gas and titanium chloride gas. By feeding the gas 211 in this manner, the residual chlorine is transformed into hydrogen chloride that can be easily exhausted. As a result, the partial pressures of chlorine gas and titanium chloride gas left in the reaction chamber 201 can be reduced. When the partial pressures of the chlorine gas and titanium chloride gas decrease, the thickness of the titanium film 106 can be controlled more accurately. If a silane gas is used as the gas 211, the titanium films 206 deposited in the reaction chamber 201 can be transformed into a silicide. As a result, silicide films 206a can be formed, as shown in FIG. 2B. When the silicide films 206a are formed in this manner, no titanium chloride gas is newly produced even in the presence of chlorine or a gas containing it in the atmosphere. This is because, the binding energy between silicon and titanium is higher than that between titanium and chlorine.

Note that when this hydrogenated gas 211 is fed, RF discharge of several hundred kW may be applied between the upper electrode 204 and the substrate holder 202. This produces a plasma in the reaction chamber 201 to accelerate the production of the above hydrogen chloride.

As described above, according to the first embodiment, before a titanium film is formed, the temperature in the reaction chamber of the titanium film forming apparatus is set to a temperature or more at which hydrogen chloride is produced in the presence of chlorine and hydrogen. At this temperature, a hydrogenated gas such as $SiH_4$, $Si_2H_2$, $B_2H_6$, or $AsH_4$ is fed into the reaction chamber. In this case, after this hydrogenated gas is fed, RF discharge may be caused in the reaction chamber to produce a plasma. If a silane gas is used as a hydrogenated gas, titanium deposited in the reaction chamber can be transformed into a silicide. This can suppress the generation of titanium chloride even in the presence of chlorine gas.

According to the first embodiment, therefore, a stable titanium tetrachloride partial pressure can be obtained in forming a titanium film. That is, the thickness of a titanium film to be formed can be accurately controlled, and hence the electrical characteristics of each electrode to be brought into contact with this film can be stabilized.

Second Embodiment

The second embodiment of the present invention will be described next with reference to the accompanying drawings.

Figures 3A, 3B:
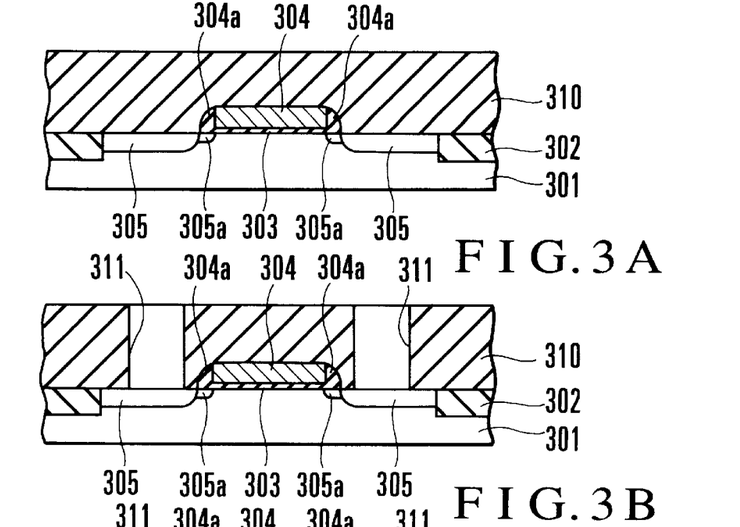
FIGS. 3A to 3E are sectional views for explaining the process of manufacturing a semiconductor device by using a titanium film forming method according to the second embodiment of the present invention.

First of all, as shown in FIG. 3A, silicon oxide is deposited on a silicon substrate 301, on which a MOS transistor is formed, so as to form an insulating interlayer 310 having a thickness of about 2 $\mu$m. This MOS transistor has a known LDD structure. The MOS transistor is formed in a region, of the silicon substrate 301, which is partitioned by an element isolation oxide film 302 having a thickness of about 200 nm. In addition, the MOS transistor includes a gate electrode 304 formed through a gate insulating film 303, side walls 304a formed on the side surfaces of the gate electrode 304, a source and drain 305 formed by doping portions, of the silicon substrate 301, which are located on the sides of the side walls 104a of the gate electrode 104 with an impurity having a desired conductivity, and lightly doped regions (LDD) 305a formed under the side walls 304a.

Subsequently, as shown in FIG. 3B, contact holes 311 are formed in the insulating interlayer 310 to expose the surfaces of the sour/drain 305 formation regions. These holes may be formed by using a mask pattern formed by a known photolithographic technique, and selectively etching the insulating interlayer 310 by using the mask pattern as a mask. Note that this mask pattern is removed after the contact holes 311 are formed.

Figure 3C:
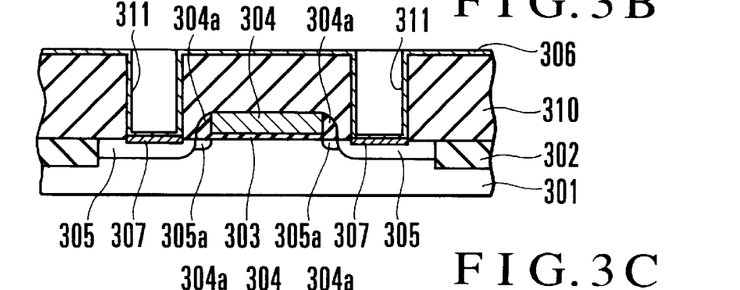

As shown in FIG. 3C, a titanium film 306 having a thickness of about 10 nm is formed on the insulating interlayer 310 including the bottom portions and side surfaces of the contact holes 311.

Figure 4A:
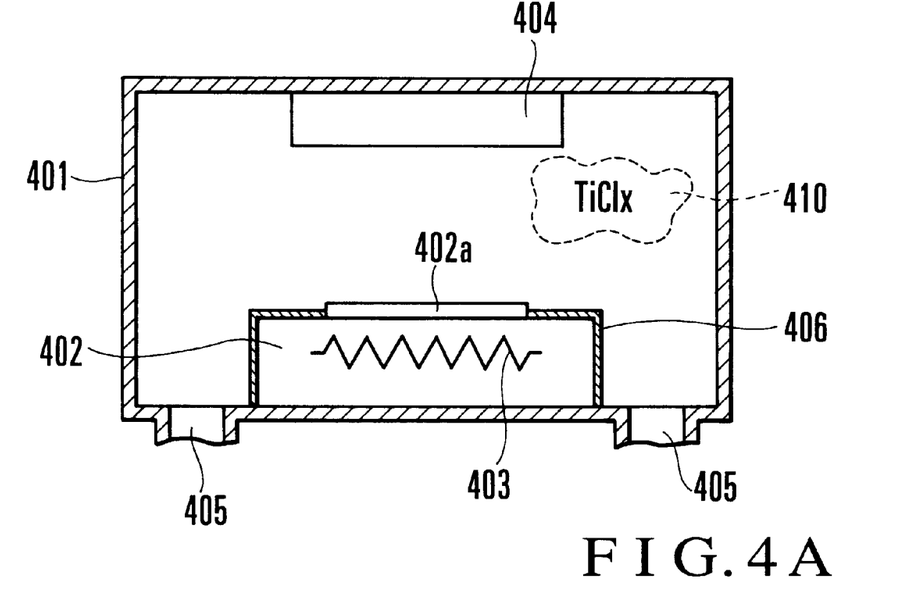
FIGS. 4A and 4B are sectional views showing the arrangement of a titanium film forming apparatus according to the second embodiment of the present invention.

This titanium film is formed by a titanium film forming apparatus using the plasma CVD method in FIG. 4A. This titanium film forming apparatus includes a substrate holder 402, on which a substrate 402a to be processed is placed, in a reaction chamber 401. The substrate holder 402 has a resistance heater 403 and can heat the substrate 402a placed thereon. An upper electrode 404 is placed in the reaction chamber 401 to oppose the substrate holder 402. RF discharge can be applied between the upper electrode 404 and the substrate holder 402. Many holes are formed in the upper electrode 404 to allow a gas such as argon to be fed into the reaction chamber through the holes. The reaction chamber 401 can be evacuated by an evacuation means (not shown) connected to vents 405.

For example, therefore, the reaction chamber 401 is evacuated by the evacuation means (not shown), and argon gas is fed into the chamber through the upper electrode 404 to produce a predetermined vacuum in the chamber. When RF discharge is applied between the upper electrode 404 and the substrate holder 402 in this state, a plasma can be generated above the substrate holder 402. After titanium tetrachloride gas and hydrogen gas are fed into the reaction chamber 401, in addition to argon, the plasma is generated to form a titanium film on the substrate 402a placed on the substrate holder 402.

In this case, for example, the titanium film is formed under the following conditions. Titanium tetrachloride, hydrogen, and argon are respectively fed at 2 sccm, 1,000 sccm, and 500 sccm, the substrate temperature is controlled to become 600° C., and the pressure in the reaction chamber 401 is set to 5 Torr. In this state, an RF electric output of 500 kW is applied to generate plasma.

With the above process, as shown in FIG. 3C, the titanium film 306 is formed. At this time, the substrate temperature is set to 600° C., as described above. For this reason, as shown in FIG. 3C, a titanium silicide film 307 having a thickness of about 20 nm is formed on the bottom portion of each contact hole 311. This film is formed when the titanium film 306 reacts with the silicon substrate 301, and the titanium film 306 partly becomes a silicide. The titanium silicide film 307 then functions as a barrier film.

As described in the first embodiment, the thickness of the titanium film 306 in FIG. 3C greatly influences the connection state of the interconnection connected to the sour/drain 305. After the titanium film 306 is formed, a residual gas 410 such as chlorine or titanium chloride is left in the reaction chamber 401, as shown in FIG. 4A. This residual gas 410 poses a problem when a titanium film is formed by using this titanium film forming apparatus.

Figure 4B:
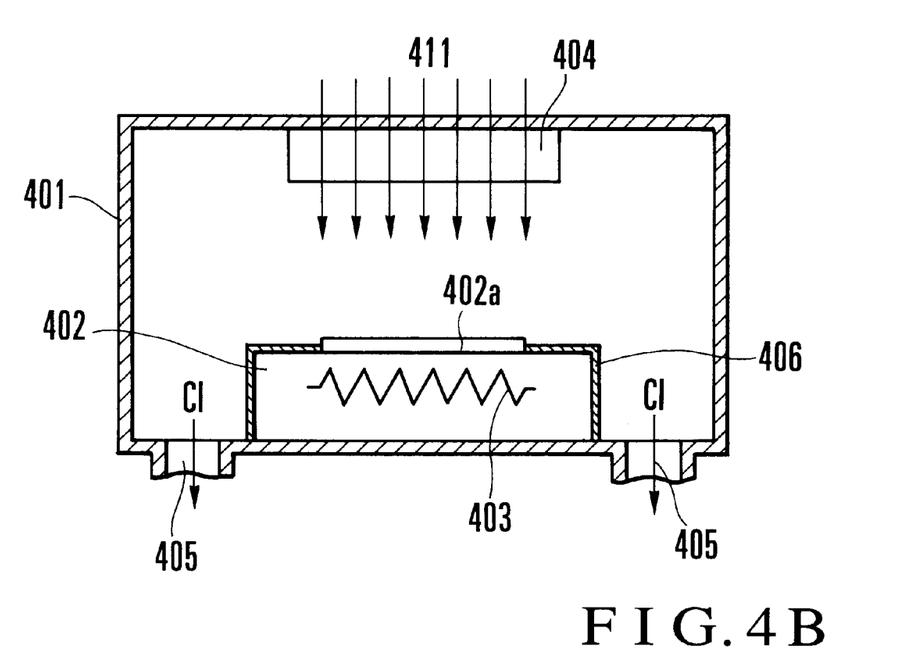

In the second embodiment, therefore, after the titanium film 306 is formed, a hydrogenated gas 411 is fed into the reaction chamber 401 while the substrate 402a (silicon substrate 301) is placed in the reaction chamber 401, as shown in FIG. 4B.

With this operation, as in the first embodiment, the partial pressure of the residual gas 410 such as titanium halide in the reaction chamber 401 can be reduced. That is, gases such as chlorine and titanium chloride left in the reaction chamber 401 can be reduced. As a result, in a titanium film forming process using this titanium film forming apparatus, the thickness of the titanium film can be accurately controlled.

Figure 3D:
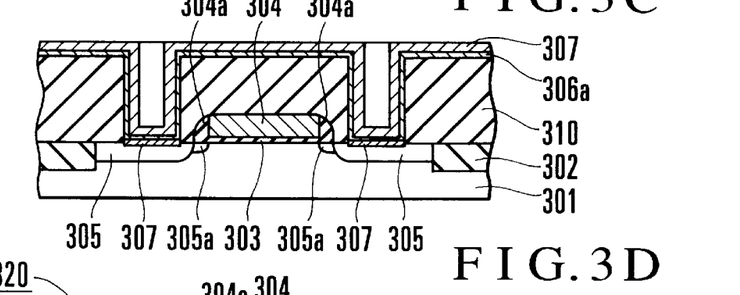

If a silane gas such as $SiH_4$ or $Si_2H_2$ is used as a hydrogenated gas, the titanium film 306 formed on the silicon substrate 301 is transformed into a silicide. As a result, as shown in FIG. 3D, a titanium nitride film 308 having a thickness of about 50 nm can be formed on a titanium silicide film 306a by CVD. This is because, a titanium nitride film can be deposited on the titanium silicide film without peeling. The titanium nitride film 308 is formed under the following process conditions. Titanium tetrachloride, ammonia, and nitrogen are respectively fed at 40 sccm, 100 sccm, and 3,000 sccm, the pressure is set to 20 Torr, and the substrate temperature is set to 600° C.

Figure 3E:
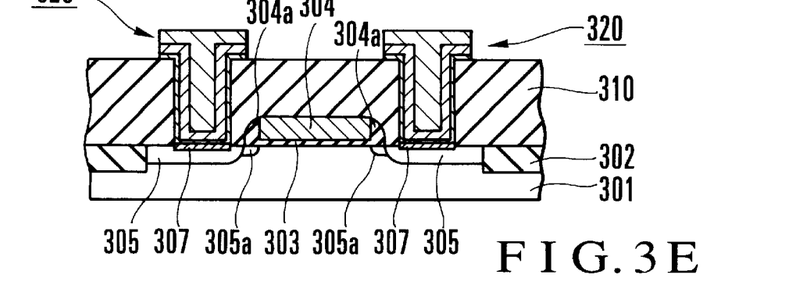

After this process, a tungsten film is formed by CVD using $WF_6$ as a source gas. This tungsten film and the titanium nitride films 306a and 308 on the insulating interlayer 310 may be patterned to form interconnections 320 connected to the source and drain 305, as shown in FIG. 3E.

As described above, according to the second embodiment, when a titanium film is to be formed on a substrate by using a titanium film forming apparatus as a forming apparatus based on the plasma CVD method, the following process is performed after a titanium film is formed. First of all, after the titanium film is formed on the substrate, the temperature in the reaction chamber of the titanium film forming apparatus is set to a temperature or more at which hydrogen chloride is produced in the presence of chlorine and hydrogen while the substrate is placed in the reaction chamber. At this temperature, a hydrogenated gas such as $SiH_4$, $Si_2H_2$, $B_2H_6$, or $AsH_4$ is fed into the reaction chamber.

If a silane gas is used as a hydrogenated gas, a titanium film formed on the substrate can be transformed into a silicide film. If a silane is used as a hydrogenated substance, titanium deposited in the reaction chamber can be transformed into a silicide. This can suppress the generation of titanium chloride even in the presence of chlorine gas.

According to the second embodiment, therefore, chlorine gas and titanium chloride gas generated and left in the reaction chamber upon formation of a titanium film can be reduced.

As a result, a stable titanium tetrachloride partial pressure can be obtained when a second titanium film is formed after a first titanium film is formed on the substrate, thereby obtaining a stable titanium deposition rate. That is, the thickness of a titanium film to be formed can be accurately controlled.

As described above in the second embodiment, a hydrogenated gas for reducing chlorine gas and titanium chloride gas left in the titanium film forming apparatus based on the plasma CVD method can be fed in the apparatus even if a substrate to be processed, on which the titanium film is formed, is present in the reaction chamber.

As has been described above, a titanium film forming method of the present invention comprises at least the first step of setting temperatures of an inner wall of a reaction chamber (201) evacuated to a predetermined vacuum and a structural member (202) placed in the reaction chamber to not less than a temperature at which hydrogen chloride is produced by chlorine and hydrogen, and feeding a hydrogenated gas into the reaction chamber for a predetermined period of time, the second step of placing a substrate (101) to be processed in the reaction chamber after feeding of the hydrogenated gas into the reaction chamber is stopped, the third step of evacuating the reaction chamber to a predetermined vacuum, and the fourth step of respectively feeding at least titanium chloride gas and argon gas into the reaction chamber at predetermined flow rates, generating a plasma of the gases above a film formation surface of the substrate, and forming a titanium film (106) on the substrate.

With this arrangement, in the first step, chlorine gas and titanium chloride gas left in the reaction chamber are reduced. According to the present invention, therefore, when a titanium film is formed on a substrate, since the amount of titanium chloride gas used for the film formation becomes almost equal to the amount of titanium chloride gas fed into the reaction chamber, the thickness of a titanium film to be formed can be accurately controlled.

In addition, a titanium film forming method of the present invention comprises at least the first step of placing a first substrate (301) to be processed in a reaction chamber (401), the second step of evacuating the reaction chamber to a predetermined vacuum, the third step of respectively feeding at least titanium chloride gas and argon gas into the reaction chamber at predetermined flow rates, generating a plasma of the gases above a film formation surface of the first substrate, and forming a titanium film (306) on the first substrate, the fourth step of setting temperatures of an inner wall of the reaction chamber and a structural member (402) placed in the reaction chamber to not less than a temperature at which hydrogen chloride is generated by chlorine and hydrogen, and feeding a hydrogenated gas into the reaction chamber for a predetermined period of time, the fifth step of unloading the first substrate from the reaction chamber after feeding of the hydrogenated gas into the reaction chamber is stopped, the sixth step of placing a second substrate in the reaction chamber, the seventh step of evacuating the reaction chamber to a predetermined vacuum, and the eighth step of respectively feeding at least titanium chloride gas and argon gas into the reaction chamber at predetermined flow rates, generating plasma of the gases above a film formation surface of the substrate, and forming a titanium film on the second substrate.

With this arrangement, in the fourth step, chlorine gas and titanium chloride gas left in the reaction chamber are reduced even while the first substrate on which the titanium film is formed is placed in the reaction chamber. According to the present invention, therefore, when a titanium film is formed on the second substrate, since the amount of titanium chloride gas used for the film formation becomes almost equal to the amount of titanium chloride gas fed into the reaction chamber, the thickness of a titanium film to be formed can be accurately controlled.

What is claimed is:

1. A titanium film forming method comprising at least:

the first step of setting a temperature of an inner wall of an evacuated reaction chamber and a structural member placed in the reaction chamber to not less than a temperature at which hydrogen chloride is produced by chlorine and hydrogen, and feeding a hydrogenated gas into the reaction chamber;

the second step of placing a substrate to be processed in the reaction chamber after feeding of the hydrogenated gas into the reaction chamber is stopped;

the third step of evacuating the reaction chamber; and the fourth step of respectively feeding at least titanium chloride gas and argon gas into the reaction chamber, generating a plasma of the gases above a film formation surface of the substrate, and forming a titanium film on the substrate.

2. A titanium film forming method comprising at least:

the first step of setting a temperature of an inner wall of an evacuated reaction chamber and a structural member placed in the reaction chamber to not less than a temperature at which hydrogen chloride is produced by chlorine and hydrogen, and feeding a hydrogen gas into the reaction chamber;

the second step of placing a substrate to be processed in the reaction chamber after feeding of the hydrogenated gas into the reaction chamber is stopped;

the third step of evacuating the reaction chamber;

the fourth step of respectively feeding at least titanium chloride gas and argon gas into the reaction chamber, generating a plasma of the gases above a film formation surface of the substrate, and forming a titanium film on the substrate; and wherein the hydrogenated gas is a material selected from the group consisting of $B_2H_6$ and $AsH_4$.

3. A method according to claim 2, wherein the hydrogenated gas is a silane.

4. A method according to claim 2, wherein the first step comprises generating the plasma of the hydrogenated gas in the reaction chamber.

5. A method according to claim 4, wherein the hydrogenated gas is selected from the group consisting of $B_2H_6$ and $AsH_4$.

6. A method according to claim 4, wherein the hydrogenated gas is a silane.

7. A titanium film forming method comprising at least:

the first step of placing a first substrate to be processed in the reaction chamber;

the second step of evacuating the reaction chamber;

the third step of respectively feeding at least titanium chloride gas and argon gas into the reaction chamber, generating a plasma of the gases above a film formation surface of the first substrate, and forming a titanium film on the first substrate;

the fourth step of setting temperatures of an inner wall of the evacuated reaction chamber and a structural member placed in the reaction chamber to not less than a temperature at which hydrogen chloride is generated by chlorine and hydrogen, and feeding a hydrogenated gas into the reaction chamber;

the fifth step of unloading the first substrate form the reaction chamber after feeding of the hydrogenated gas into the reaction chamber is stopped;

the sixth step of placing a second substrate to be processed in the reaction chamber;

the seventh step of evacuating the reaction chamber; and the eighth step of respectively feeding at least titanium chloride gas and argon gas into the reaction chamber, generating a plasma of the gases above a film formation surface of the first substrate, and forming a titanium film on the first substrate.

8. A titanium film forming method comprising at least:

the first step of placing a first substrate to be processed in the reaction chamber;

the second step of evacuating the reaction chamber;

the third step of respectively feeding at least titanium chloride gas and argon gas into the reaction chamber, generating a plasma of the gases above a film formation surface of the first substrate, and forming a titanium film on the first substrate;

the fourth step of setting temperatures of an inner wall of the evacuated reaction chamber and a structural member placed in the reaction chamber to not less than a temperature at which hydrogen chloride is generated by chlorine and hydrogen, and feeding a hydrogenated gas into the reaction chamber;

the fifth step of unloading the first substrate from the reaction chamber after feeding of the hydrogenated gas into the reaction chamber is stopped;

the sixth step of placing a second substrate to be processed in the reaction chamber;

the seventh step of evacuating the reaction chamber;

the eighth step of respectively feeding at least titanium chloride gas and argon gas into the reaction chamber, generating a plasma of the gases above a film formation surface of the first substrate, and forming a titanium film on the first substrate; and wherein the hydrogenated gas is a material selected from the group consisting of $B_2H_6$ and $AsH_4$.

9. A method according to claim 8, wherein the hydrogenated gas is a silane.

10. A method according to claim 8, wherein the first step comprises generating the plasma of the hydrogenated gas in the reaction chamber.

11. A method according to claim 10, wherein the hydrogenated gas is selected from the group consisting of $B_2H_6$ and $AsH_4$.

12. A method according to claim 10, wherein the hydrogenated gas is a silane.

* * * * *